United States Patent
Saito

(10) Patent No.: US 11,333,720 B2
(45) Date of Patent: *May 17, 2022

(54) MAGNETIC-FIELD-APPLYING BIAS FILM AND MAGNETIC DETECTING ELEMENT AND MAGNETIC DETECTION DEVICE THEREWITH

(71) Applicant: Alps Alpine Co., Ltd., Tokyo (JP)

(72) Inventor: Masamichi Saito, Miyagi-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 16 days.

This patent is subject to a terminal disclaimer.

(21) Appl. No.: 16/909,559

(22) Filed: Jun. 23, 2020

(65) Prior Publication Data

US 2020/0319273 A1 Oct. 8, 2020

Related U.S. Application Data

(63) Continuation of application No. PCT/JP2018/046840, filed on Dec. 19, 2018.

(30) Foreign Application Priority Data

Dec. 26, 2017 (JP) .............................. JP2017-249081

(51) Int. Cl.
  *G01R 33/09* (2006.01)
  *G01R 33/00* (2006.01)
  (Continued)

(52) U.S. Cl.
  CPC ......... *G01R 33/09* (2013.01); *G01R 33/0017* (2013.01); *H01L 43/08* (2013.01); *H01L 43/10* (2013.01)

(58) Field of Classification Search
  CPC ........................... G01R 33/093; G01R 33/098
  See application file for complete search history.

(56) References Cited

U.S. PATENT DOCUMENTS

| 6,982,855 B2 | 1/2006 | Shimazawa et al. |
| 7,023,670 B2 * | 4/2006 | Saito ...................... B82Y 10/00 |
| | | 360/324.12 |

(Continued)

FOREIGN PATENT DOCUMENTS

| JP | 2003-338644 | 11/2003 |
| JP | 2003-346309 | 12/2003 |
| JP | 2016-151448 | 8/2016 |

OTHER PUBLICATIONS

International Search Report from corresponding International Application No. PCT/JP2018/046840, 8pgs, dated Mar. 5, 2019.

(Continued)

*Primary Examiner* — Alesa Allgood
(74) *Attorney, Agent, or Firm* — Crowell & Morning LLP

(57) ABSTRACT

A magnetic-field-applying bias film exhibiting resistance to a high magnetic field has an exchange-coupled film including a permanent magnet layer and an antiferromagnetic layer stacked on the permanent magnet layer. The antiferromagnetic layer includes an X(Cr—Mn) layer containing Cr, Mn, and one or two or more elements selected from the group consisting of platinum-group elements and Ni. The X(Cr—Mn) layer has a first region relatively near to the permanent magnet layer and a second region relatively distant from the permanent magnet layer. Mn content in the first region is higher than Mn content in the second region.

16 Claims, 14 Drawing Sheets

(51) Int. Cl.
    *H01L 43/08*     (2006.01)
    *H01L 43/10*     (2006.01)

(56)         References Cited

U.S. PATENT DOCUMENTS

| | | |
|---|---|---|
| 10,060,992 B2 | 8/2018 | Komasaki |
| 2003/0103299 A1 | 6/2003 | Saito |
| 2004/0134877 A1* | 7/2004 | Ishiwata ............... B82Y 10/00 |
| | | 216/22 |
| 2016/0238674 A1* | 8/2016 | Komasaki ............ G01R 33/093 |
| 2020/0161538 A1* | 5/2020 | Saito ....................... H01L 43/08 |
| 2020/0319274 A1* | 10/2020 | Saito ....................... H01L 43/10 |

OTHER PUBLICATIONS

Notice of Decision of Refusal from corresponding Japanese Patent Application No. 2019-561581, dated May 26, 2021, 7pp.

\* cited by examiner

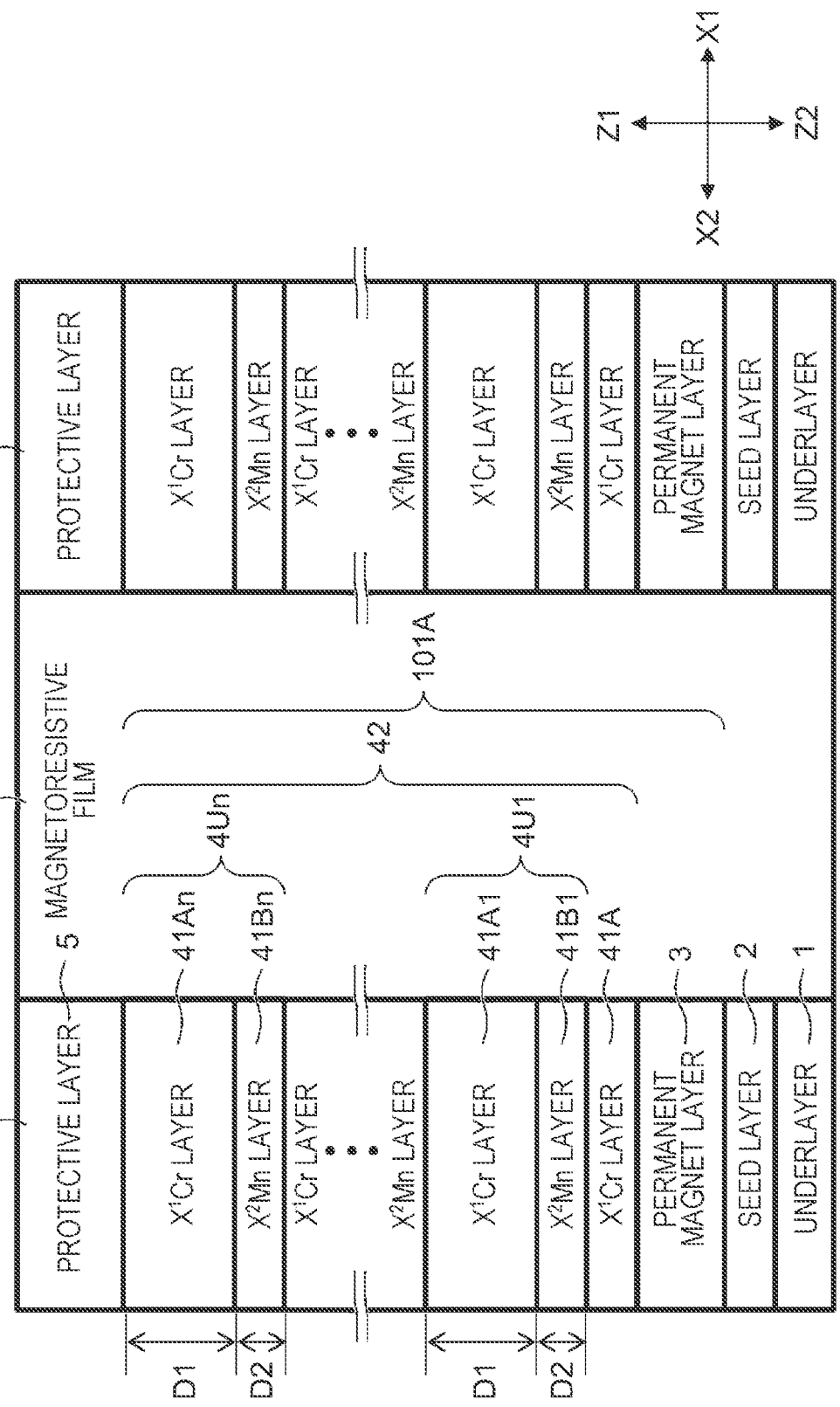

MAGNETIC-FIELD-APPLYING BIAS FILM AND MAGNETIC DETECTING ELEMENT AND MAGNETIC DETECTION DEVICE THEREWITH

CLAIM OF PRIORITY

This application is a Continuation of International Application No. PCT/JP2018/046840 filed on Dec. 19, 2018, which claims benefit of priority to Japanese Patent Application No. 2017-249081 filed on Dec. 26, 2017. The entire contents of each application noted above are hereby incorporated by reference.

BACKGROUND

1. Field of the Disclosure

The present disclosure relates to a magnetic-field-applying bias film and to a magnetic detecting element and a magnetic detection device therewith.

2. Description of the Related Art

Some magnetic detection devices (magnetic sensors) use a magnetic detecting element that includes a magnetic detecting section having a magnetoresistive film including a pinned magnetic layer and a free magnetic layer. In such magnetic detection devices, the magnetization directions of the free magnetic layer are preferably aligned in the absence of an applied external field from a viewpoint of enhancing measurement accuracy. For this reason, to align magnetization directions of the free magnetic layer in the absence of an applied external field, a magnetic detecting element sometimes has, around the magnetic detecting section, hard bias films including a permanent magnet layer (see, for example, Japanese Unexamined Patent Application Publication No. 2005-183614 and Japanese Unexamined Patent Application Publication No. 2016-130686).

Such a hard bias film can maintain the magnetized state in any direction through magnetization of its permanent magnet layer formed from a hard magnetic material and thus can easily align the magnetization directions of a free magnetic layer. In other words, a hard bias film can easily realize the function (biasing function) of aligning the magnetization directions of a free magnetic layer. However, when the intensity of an external field is particularly high and a field exceeding the coercivity Hc of the permanent magnet layer is applied, a hard bias film is magnetized in the direction of the applied field, thereby losing the biasing function. Nowadays, magnetic detection devices are disposed in the vicinity of high-field sources, such as high-output motors, in some cases. Accordingly, a magnetic-field-applying bias film, which can act as a hard bias film, is required to be able to maintain the biasing function even in the environment of a high magnetic field to be applied, in other words, to exhibit resistance to a high magnetic field.

The present invention provides a magnetic-field-applying bias film that exhibits resistance to a high magnetic field as well as a magnetic detecting element and a magnetic detection device therewith.

SUMMARY

In an embodiment, a magnetic-field-applying bias film has an exchange-coupled film including a permanent magnet layer and an antiferromagnetic layer stacked on the permanent magnet layer. The antiferromagnetic layer includes an X(Cr—Mn) layer containing Cr, Mn, and one or two or more elements X selected from the group consisting of platinum-group elements and Ni, the X(Cr—Mn) layer has a first region relatively near to the permanent magnet layer and a second region relatively distant from the permanent magnet layer, and Mn content in the first region is higher than Mn content in the second region.

As a specific embodiment of the above-described magnetic-field-applying bias film, the antiferromagnetic layer may be formed by stacking a PtCr layer and an $X^0$Mn layer (where $X^0$ is one or two or more elements selected from the group consisting of platinum-group elements and Ni) nearer to the permanent magnet layer than the PtCr layer.

In another embodiment, a magnetic-field-applying bias film has an exchange-coupled film including a permanent magnet layer and an antiferromagnetic layer stacked on the permanent magnet layer. The antiferromagnetic layer has an alternately stacked structure in which an $X^1$Cr layer (where $X^1$ is one or two or more elements selected from the group consisting of platinum-group elements and Ni) and an $X^2$Mn layer (where $X^2$ is one or two or more elements selected from the group consisting of platinum-group elements and Ni and may be the same as or different from $X^1$) are alternately stacked in three or more layers.

As another embodiment, a magnetic detecting element includes: a magnetic detecting section having a magnetoresistive film including a pinned magnetic layer and a free magnetic layer; and the above-described magnetic-field-applying bias film, where the magnetic-field-applying bias film is arranged around the magnetic detecting section to align magnetization directions of the free magnetic layer in the absence of an external field applied to the free magnetic layer.

As still another embodiment, a magnetic detection device includes the above-described magnetic detecting element. Such a magnetic detection device may include a plurality of the above-described magnetic detecting elements on a single substrate, and the plurality of magnetic detecting elements may include pinned magnetic layers having different pinned magnetization directions.

According to the present invention, a magnetic-field-applying bias film exhibiting excellent resistance to a high magnetic field is provided. Accordingly, by using the magnetic-field-applying bias film of the present invention, it is possible to provide a magnetic detection device that is stable even in a high-field environment.

BRIEF DESCRIPTION OF THE DRAWINGS

FIG. 2A is viewed in the Z1-Z2 direction and FIG. 2B is viewed in the Y1-Y2 direction;

FIG. 7A is viewed in the Z1-Z2 direction and FIG. 7B is viewed in the Y1-Y2 direction;

FIGS. 8A and 8B illustrate the configuration of a magnetic detecting element according to a modification of the second embodiment of the present invention, where FIG. 8A is viewed in the Z1-Z2 direction and FIG. 8B is viewed in the Y1-Y2 direction;

DESCRIPTION OF THE EXEMPLARY EMBODIMENTS

Figure 1:
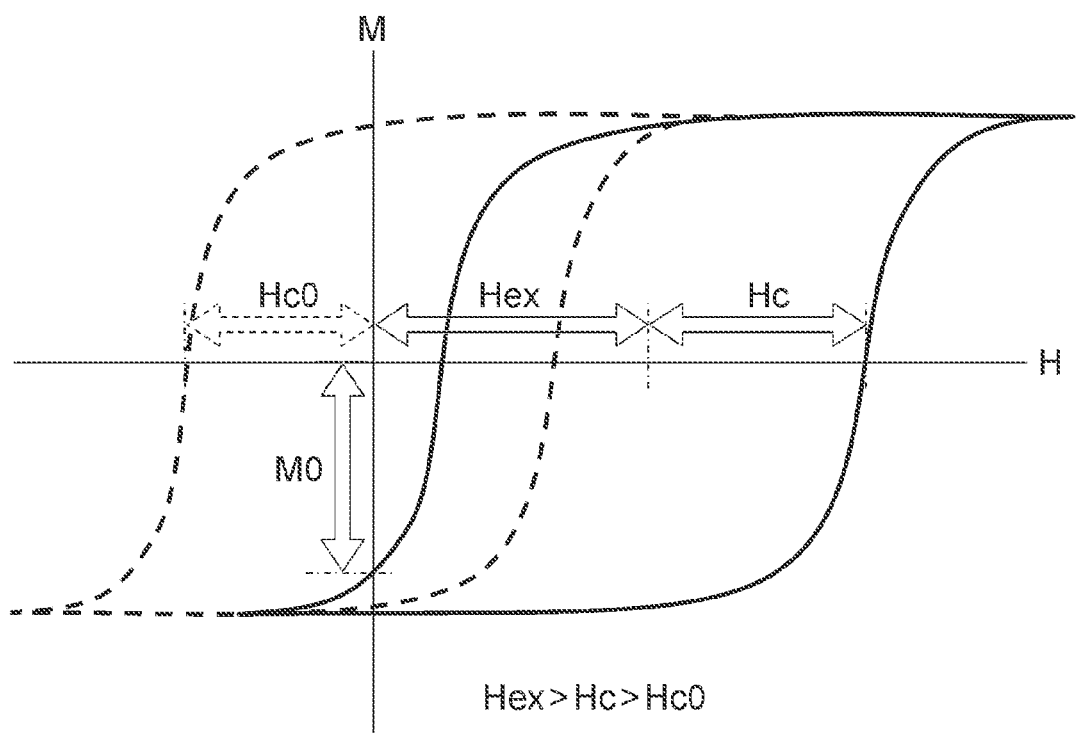
FIG. 1 shows a hysteresis loop in the magnetization curve of the magnetic-field-applying bias film according to the present invention.

FIG. 1 shows a hysteresis loop in the magnetization curve of the magnetic-field-applying bias film according to the present invention. The hysteresis loop formed by the M-H curve (magnetization curve) of a hard bias film formed of a permanent magnet layer typically has a symmetrical shape about the intersection between the H axis and the M axis (magnetic field H=0 A/m, magnetization M=0 A/m) as a center, like the dashed-line curve shown in FIG. 1. Here, the intercept of the hysteresis loop with the H axis is the coercivity Hc0, and a higher coercivity Hc0 means a better biasing function of the hard bias film.

The magnetic-field-applying bias film according to the present invention is shown with the solid line in FIG. 1. As shown, since the bias film has a structure of an antiferromagnetic layer stacked on a permanent magnet layer, an exchange coupling field Hex acts on the permanent magnet layer. Consequently, the hysteresis loop has a shape shifted along the H axis in response to the magnitude of the exchange coupling field Hex. As a result, a high remanent magnetization M0 remains even in the absence of an applied external field, thereby making it possible to fulfill an excellent biasing function.

Moreover, by having the structure of an antiferromagnetic layer stacked on a permanent magnet layer, the magnetic-field-applying bias film has a coercivity Hc higher than the coercivity Hc0 of the permanent magnet layer alone. Consequently, the magnetic-field-applying bias film is less likely to lose the biasing function due to magnetization of the permanent magnet layer in directions other than the predetermined direction even in a high-field environment. In other words, the magnetic-field-applying bias film according to the present invention exhibits resistance to a high magnetic field.

Figure 2A:
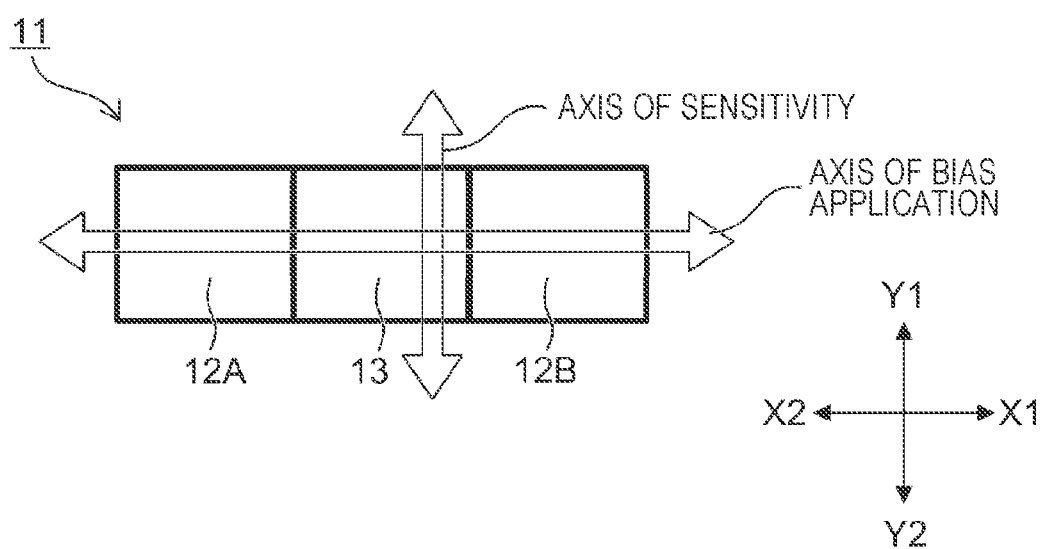
FIGS. 2A and 2B illustrate the configuration of a magnetic detecting element according to a first embodiment of the present invention, where
Figure 2B:
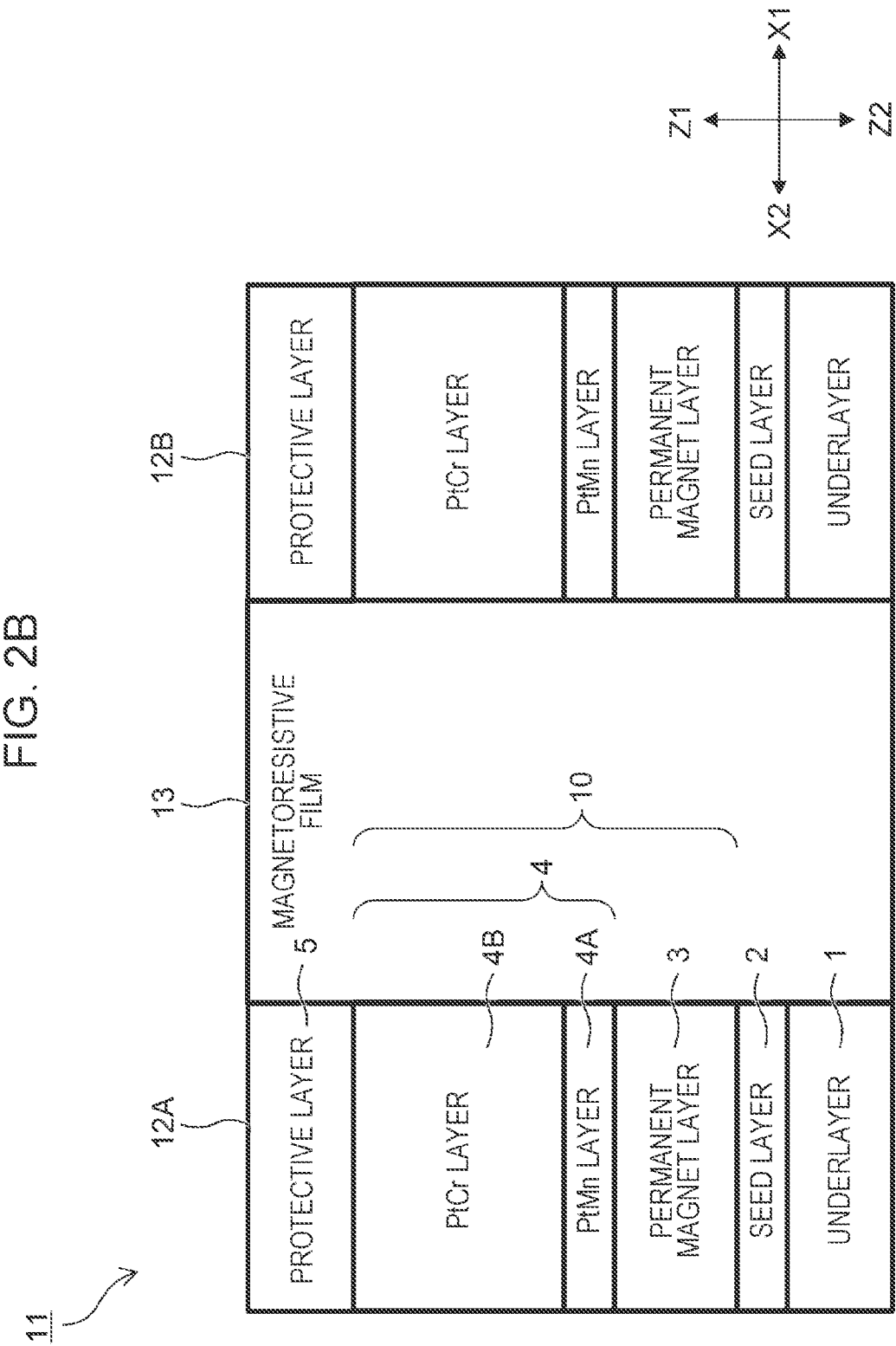

FIGS. 2A and 2B conceptually illustrate the configuration of a magnetic detecting element according to a first embodiment of the present invention.

The magnetic detecting element 11 according to the present embodiment includes: a magnetic detecting section 13 provided with a magnetoresistive film having an axis of sensitivity in the Y1-Y2 direction of FIG. 2A; a magnetic-field-applying bias film 12A positioned around the magnetic detecting section 13, specifically, positioned on the X2 side in the X1-X2 direction orthogonal to the axis of sensitivity of the magnetic detecting section 13; and a magnetic-field-applying bias film 12B positioned, relative to the magnetic detecting section 13, on the X1 side in the X1-X2 direction. As long as a pinned magnetic layer and a free magnetic layer are included, the magnetoresistive film is not limited in its type. Such a magnetoresistive film may be a giant magnetoresistive film (GMR film) or a tunnel magnetoresistive film (TMR film). The same applies to other embodiments.

Each of the magnetic-field-applying bias films 12A and 12B has a stacked structure of an underlayer 1, a seed layer 2, a permanent magnet layer 3, an antiferromagnetic layer 4, and a protective layer 5 from the Z2 side toward the Z1 side in the Z1-Z2 direction. The permanent magnet layer 3 and the antiferromagnetic layer 4 constitute an exchange-coupled film 10.

The permanent magnet layer 3 may be formed from any so-called hard magnetic material and examples include 80CoPt ($Co_{80at\%}Pt_{20at\%}$). The permanent magnet layer 3 has a coercivity Hc higher than soft magnetic materials and is magnetized upon application of an external field exceeding the coercivity Hc to have a predetermined intensity of remanent magnetization M0 even after terminating application of the external field. This remanent magnetization M0 acts on the free magnetic layer of the magnetoresistive film, thereby making it possible to align the magnetization directions of the free magnetic layer. Through exchange coupling with the antiferromagnetic layer 4, not only an exchange coupling field Hex is generated in the permanent magnet layer 3, but also the coercivity Hc of the permanent magnet layer 3 is increased relative to the coercivity Hc0 of the sole component material layer that constitutes the permanent magnet layer 3. Consequently, the permanent magnet layer 3 even in an environment of a high external field is less likely to be magnetized by such a field. Accordingly, the magnetic-field-applying bias films 12A and 12B according to the present embodiment exhibit excellent resistance to a high magnetic field.

Each antiferromagnetic layer 4 of the magnetic-field-applying bias films 12A and 12B according to the present embodiment is formed by stacking, from the side near to the permanent magnet layer 3, a PtMn layer 4A and a PtCr layer 4B. Each of these layers is formed by a sputtering process or a CVD process, for example. Here, when forming an alloy layer, such as the PtMn layer 4A of the magnetic-field-applying bias films 12A and 12B, a plurality of alloy component metals (Pt and Mn in the case of the PtMn layer 4A) may be supplied simultaneously or alternately. Specific examples of the former include simultaneous sputtering of a plurality of alloy component metals, and specific examples of the latter include alternate stacking of different metal films. In some cases, simultaneous supply of a plurality of alloy component metals is preferable to alternate supply thereof from a viewpoint of increasing the exchange coupling field Hex.

Through annealing treatment after film formation, the antiferromagnetic layer 4 is ordered and exchange coupled with the permanent magnet layer 3, thereby generating an exchange coupling field Hex in the permanent magnet layer 3 and increasing the coercivity Hc of the permanent magnet layer 3 relative to the coercivity Hc0 of the permanent magnet layer 3 alone. Here, atoms in each layer that constitutes the antiferromagnetic layer 4 interdiffuse through the above-mentioned annealing treatment.

The antiferromagnetic layer 4 of the exchange-coupled film 10 according to the present embodiment includes an X(Cr—Mn) layer containing Cr, Mn, and one or two or more elements X selected from the group consisting of platinum-group elements and Ni. The antiferromagnetic layer 4 obtained from the stacked structure illustrated in FIG. 2B is a Pt(Cr—Mn) layer since the element X is Pt. This Pt(Cr—Mn) layer has a first region relatively near to the permanent magnet layer 3 and a second region relatively distant from the permanent magnet layer 3, where Mn content in the first region is higher than Mn content in the second region. The Pt(Cr—Mn) layer having such constitution is formed by subjecting stacked PtMn layer 4A and PtCr layer 4B to annealing treatment. By performing surface analysis while sputtering, it is possible to obtain the content distribution (depth profile) of constituent elements in the depth direction.

Figure 3:
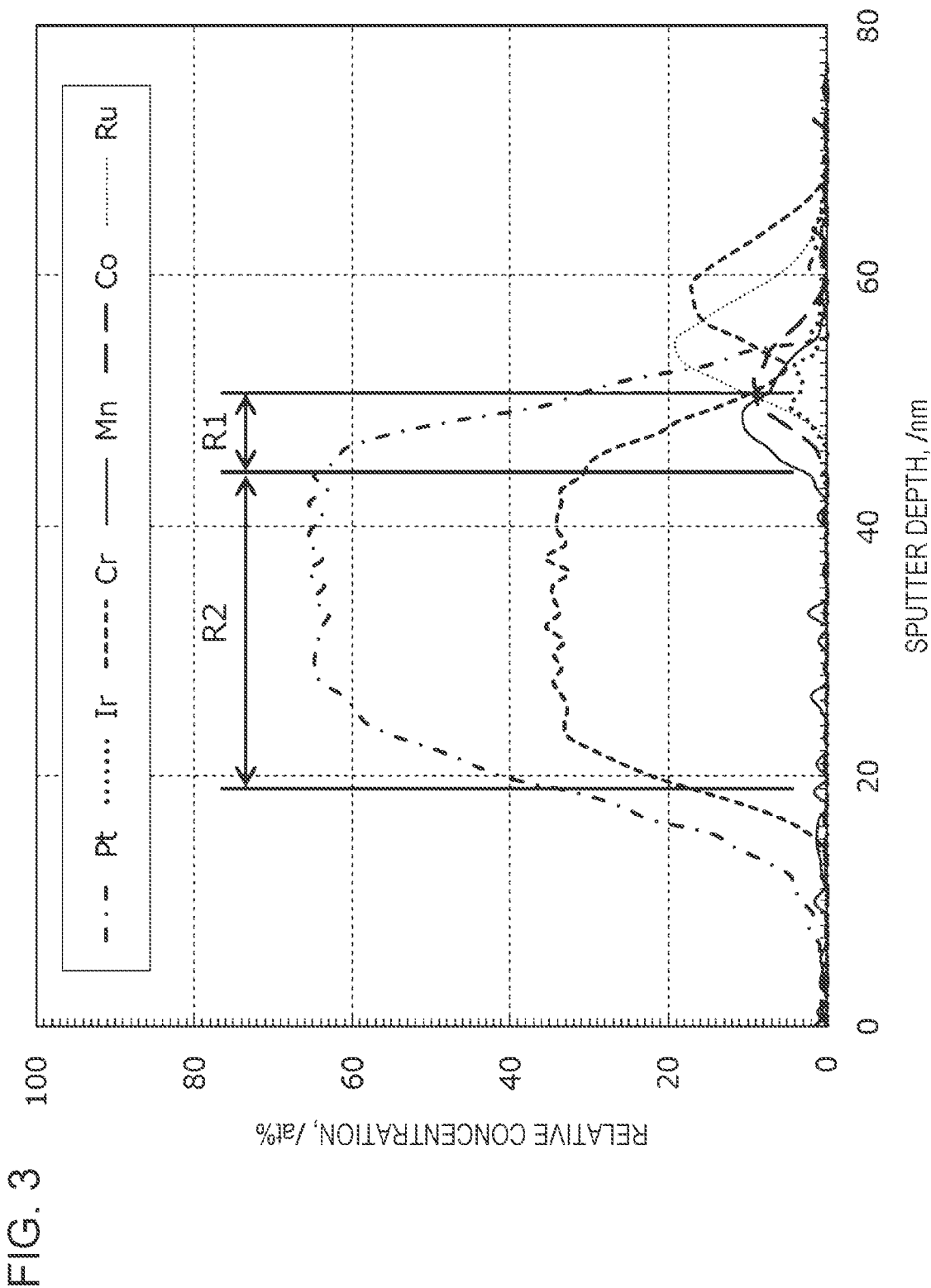
FIG. 3 is an exemplary depth profile.

FIG. 3 is an exemplary depth profile of a film including an exchange-coupled film 10 having the same configuration as the exchange-coupled film 10 according to the present embodiment. The exchange-coupled film of this film is composed of a pinned magnetic layer and an antiferromagnetic layer. The depth profile shown in FIG. 3 is obtained from a film having the configuration below after annealing treatment in a field of 15 kOe at 350° C. for 20 hours. The numerical values within the parentheses represent each thickness (Å).

substrate/underlayer: NiFeCr (40)/nonmagnetic material layer: [Cu(40)/Ru(20)]/pinned magnetic layer: $Co_{40at\%}Fe_{60at\%}$ (20)/antiferromagnetic layer [IrMn layer: $Ir_{22at\%}Mn_{78at\%}$ (10)/PtMn layer: $Pt_{50at\%}Mn_{50at\%}$ (16)/PtCr layer: $Pt_{51at\%}Cr_{49at\%}$ (300)]/protective layer: Ta (100)

The depth profile of FIG. 3 is the content distribution of Pt, Ir, Cr, and Mn in the depth direction obtained, specifically, by performing surface analysis with an Auger electron spectrometer while sputtering with argon from the protective layer side. The sputtering rate with argon was obtained in terms of $SiO_2$ to be 1.1 nm/min.

Figure 4:
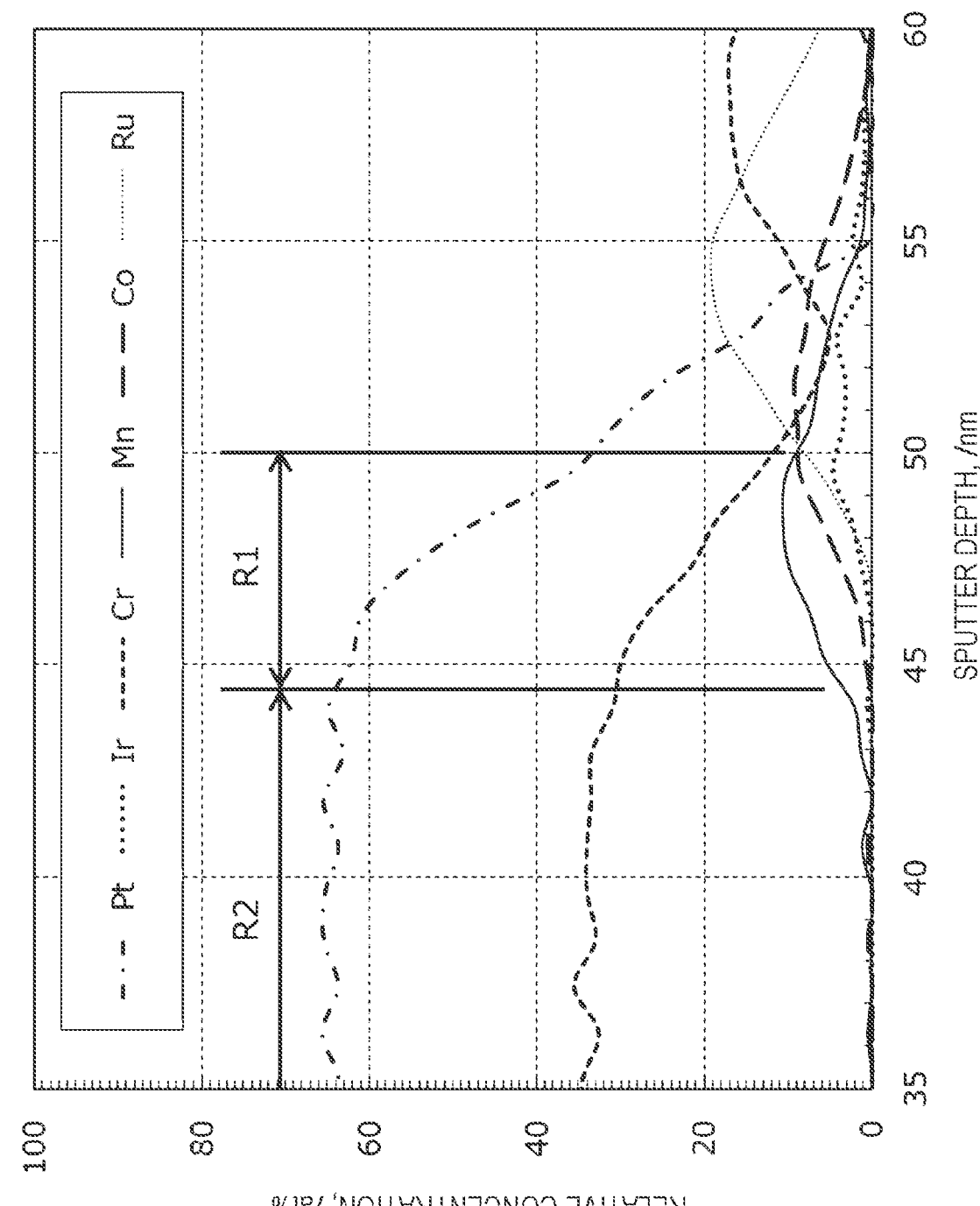
FIG. 4 is the partially enlarged depth profile of FIG. 3.

FIG. 4 is the partially enlarged FIG. 3. In both FIGS. 3 and 4, the depth profiles also include the content distribution of Co (one of the constituent elements of the pinned magnetic layer) and Ru (element constituting the antiferromagnetic layer side of the nonmagnetic material layer) to determine the depth positions of the pinned magnetic layer and the nonmagnetic material layer.

As shown in FIG. 3, the antiferromagnetic layer has a thickness of about 30 nm; includes an X(Cr—Mn) layer containing Cr, Mn, and Pt and Ir as one or two or more elements X selected from the group consisting of platinum-group elements and Ni; and specifically consists of a (Pt—Ir)(Cr—Mn) layer. The X(Cr—Mn)layer [(Pt—Ir)(Cr—Mn) layer] has a first region R1 relatively near to the pinned magnetic layer and a second region R2 relatively distant from the pinned magnetic layer, and Mn content in the first region R1 is higher than Mn content in the second region R2. Such constitution can be obtained by appropriately stacking an XCr layer, an XMn layer, and so forth to form a multilayered structure and subjecting the multilayered structure to the above-mentioned annealing treatment.

Figure 5:
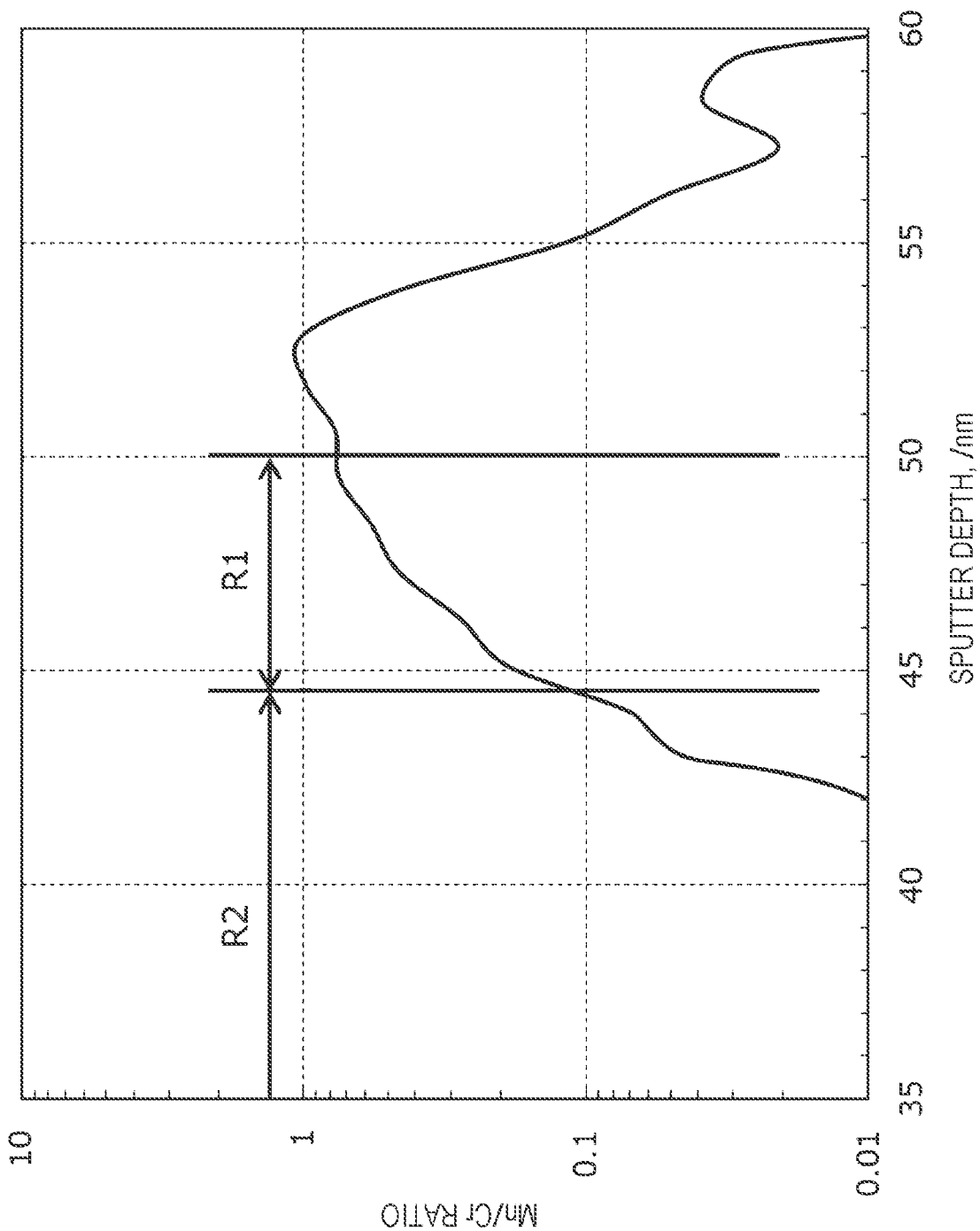
FIG. 5 is a graph showing a ratio of Mn content to Cr content (Mn/Cr ratio) determined on the basis of FIG. 4 within the same horizontal axis range as FIG. 4.

FIG. 5 is a graph showing, within the same horizontal axis range as FIG. 4, a ratio of Mn content to Cr content (Mn/Cr ratio) calculated on the basis of Mn content and Cr content at each depth that are obtained from the depth profile. Based on the results shown in FIG. 5, the depth at a Mn/Cr ratio of 0.1 is herein regarded as the boundary between the first region R1 and the second region R2. In other words, a region of the antiferromagnetic layer that is near to the pinned magnetic layer and has a Mn/Cr ratio of 0.1 or more is defined as the first region R1 and the region other than the first region of the antiferromagnetic layer is defined as the second region R2. According to this definition, the boundary between the first region R1 and the second region R2 in the depth profile shown in FIG. 3 is positioned at a depth of about 44.5 nm.

Not only does a higher Mn/Cr ratio affect the magnitude of an exchange coupling field Hex, but also a Hex/Hc value tends to be a positive and larger absolute value as the Mn/Cr ratio increases. Specifically, the first region R1 preferably includes a portion having the Mn/Cr ratio of 0.3 or more, more preferably includes a portion having the Mn/Cr ratio of 0.7 or more, and particularly preferably includes a portion having the Mn/Cr ratio of 1 or more.

As just described, since the first region R1 contains relatively more Mn, the magnetic-field-applying bias films 12A and 12B according to the present embodiment can generate a high exchange coupling field Hex. Meanwhile, since the second region R2 has allow Mn content and a relatively high Cr content, the antiferromagnetic layer 4 has a high blocking temperature Tb. For this reason, the magnetic-field-applying bias films 12A and 12B according to the present embodiment is less likely to lose the biasing function even in a high-temperature environment.

The underlayer 1 and the protective layer 5 are formed from tantalum (Ta), for example. The seed layer 2 may be formed from Cr and so forth.

In the antiferromagnetic layer 4 of the magnetic-field-applying bias films 12A and 12B according to the above-described present embodiment, the PtMn layer 4A is stacked in contact with the permanent magnet layer 3, and the PtCr layer 4B is stacked on this PtMn layer 4A. Here, the PtMn layer 4A is a specific example of the $X^0Mn$ layer (where $X^0$ is one or two or more elements selected from the group consisting of platinum-group elements and Ni). In other words, the magnetic-field-applying bias films 12A and 12B are the case in which the $X^0Mn$ layer has a single-layered structure and $X^0$ is Pt. $X^0$ may be an element other than Pt, whereas the $X^0Mn$ layer may be formed by stacking a plurality of layers. Specific examples of such $X^0Mn$ layers include a case in which the $X^0Mn$ layer is an IrMn layer and a case in which an IrMn layer and a PtMn layer are stacked in this order from the side near to the permanent magnet layer 3. Another specific example is a case in which a PtMn layer, an IrMn layer, and a PtMn layer are stacked in this order from the side near to the permanent magnet layer 3.

The magnetic-field-applying bias films 12A and 12B according to the above-described present embodiment has a structure in which the antiferromagnetic layer 4 is stacked on the permanent magnet layer 3. However, the stacking order may be reversed to have a structure in which the permanent magnet layer 3 is stacked on the antiferromagnetic layer 4.

In the magnetic detecting element 11 according to the above-described present embodiment, the two magnetic-field-applying bias films 12A and 12B are arranged aligning in the X1-X2 direction orthogonal to the direction of the axis of sensitivity (Y1-Y2 direction), and both the magnetization directions of the permanent magnet layers 3 of these bias films are aligned in the X1-X2 direction. Consequently, the direction of the axis of bias application is positioned orthogonal to the direction of the axis of sensitivity (Y1-Y2 direction) of the magnetic detecting section 13. However, as described in Japanese Unexamined Patent Application Publication No. 2016-130686 as well, it is possible to set the axis of bias application to any direction by adjusting, in the magnetic detecting element 11, the relative positions between the magnetic detecting section 13 and the two magnetic-field-applying bias films 12A and 12B and/or the magnetization directions of the permanent magnet layers 3 of the two magnetic-field-applying bias films 12A and 12B.

Figure 6A:
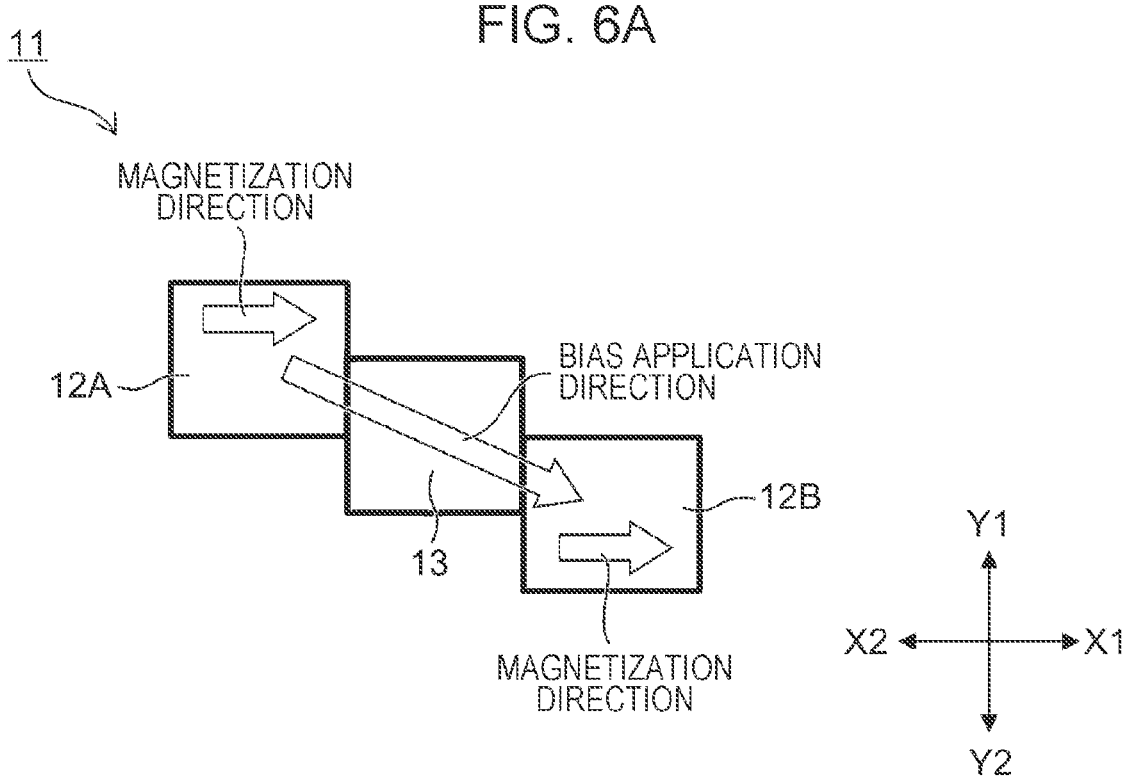
FIGS. 6A and 6B illustrate the configurations of magnetic detecting elements according to modifications of the first embodiment of the present invention.

As a specific example of setting the axis of bias application by such arrangement, it is possible, by two magnetic-field-applying bias films 12A and 12B both of whose magnetization directions point the X1 side in the X1-X2 direction as illustrated in FIG. 6A, to tilt the bias application direction from the X2 side in the X1-X2 direction toward the Y2 side in the Y1-Y2 direction by arranging one magnetic-field-applying bias film 12A, which is positioned on the X2 side in the X1-X2 direction of the magnetic detecting section 13, on the Y1 side in the Y1-Y2 direction and arranging the other magnetic-field-applying bias film 12B, which is positioned on the X1 side in the X1-X2 direction of the magnetic detecting section 13, on the Y2 side in the Y1-Y2 direction.

Figure 6B:
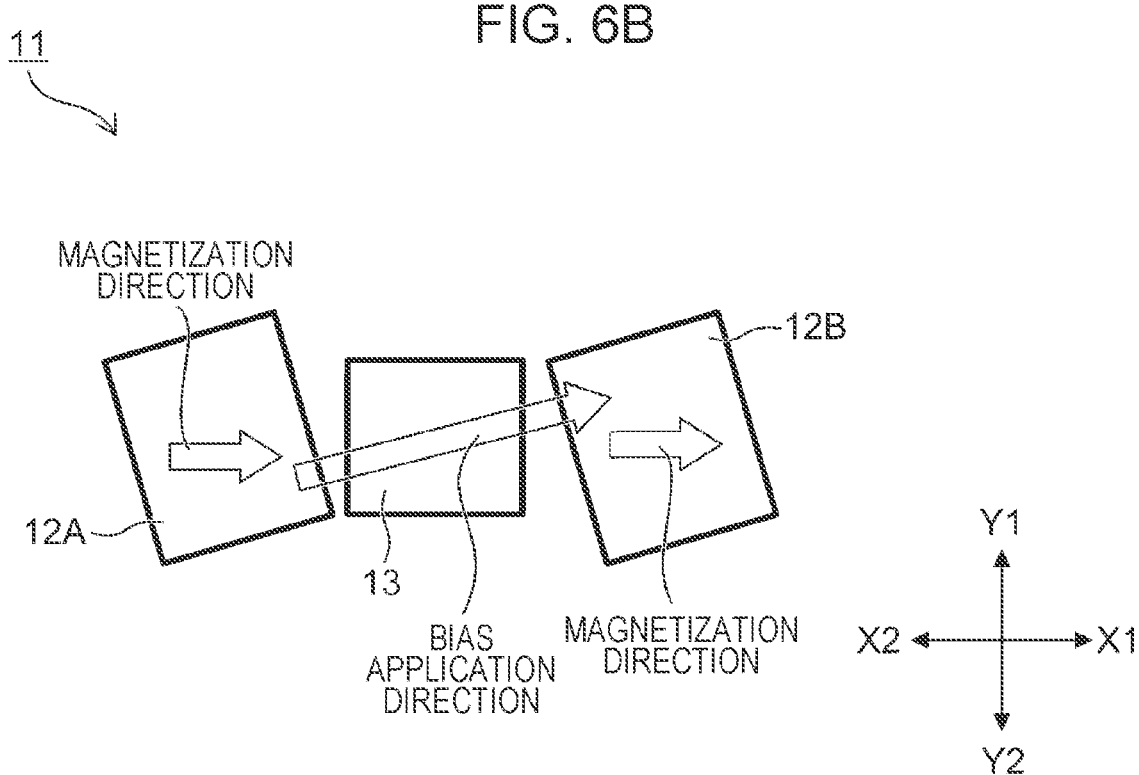

Alternatively, it is also possible, by the two magnetic-field-applying bias films 12A and 12B that are arranged aligning in the X1-X2 direction relative to the magnetic detecting section 13 and both of whose magnetization directions point the X1 side in the X1-X2 direction as illustrated in FIG. 6B, to tilt the bias application direction from the X2 side in the X1-X2 direction toward the Y1 side in the Y1-Y2 direction by adjusting the respective shapes of the magnetic-field-applying bias films 12A and 12B to arrange one magnetic-field-applying bias film 12A, which is positioned on the X2 side in the X1-X2 direction of the magnetic detecting section 13, nearer to the magnetic detecting section 13 toward the Y2 side in the Y1-Y2 direction and to arrange the other magnetic-field-applying bias film 12B, which is positioned on the X1 side in the X1-X2 direction of the magnetic detecting section 13, nearer to the magnetic detecting section 13 toward the Y1 side in the Y1-Y2 direction.

Magnetic Detecting Element According to Second Embodiment

Figure 7A:
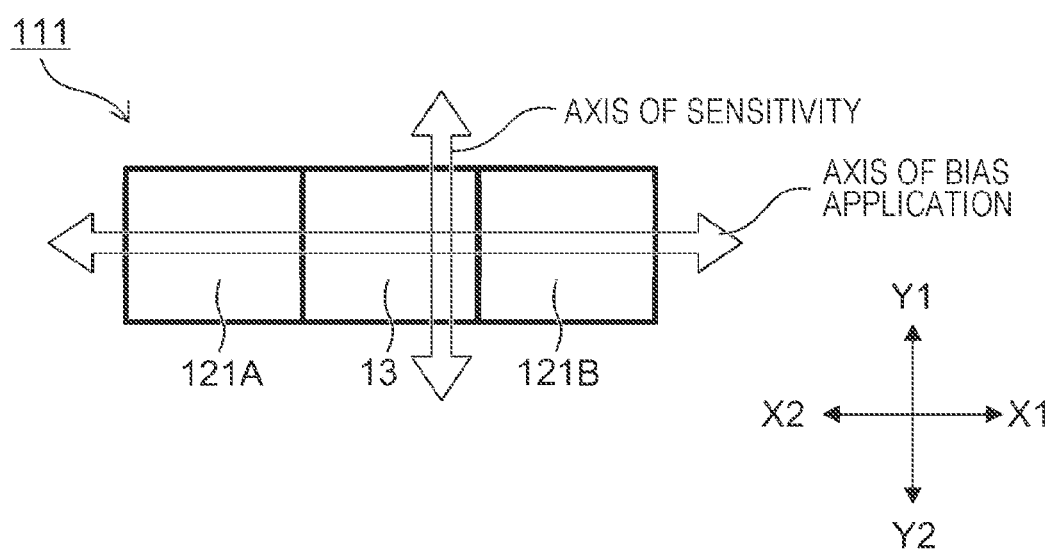
FIGS. 7A and 7B illustrate the configuration of a magnetic detecting element according to a second embodiment of the present invention, where
Figure 7B:
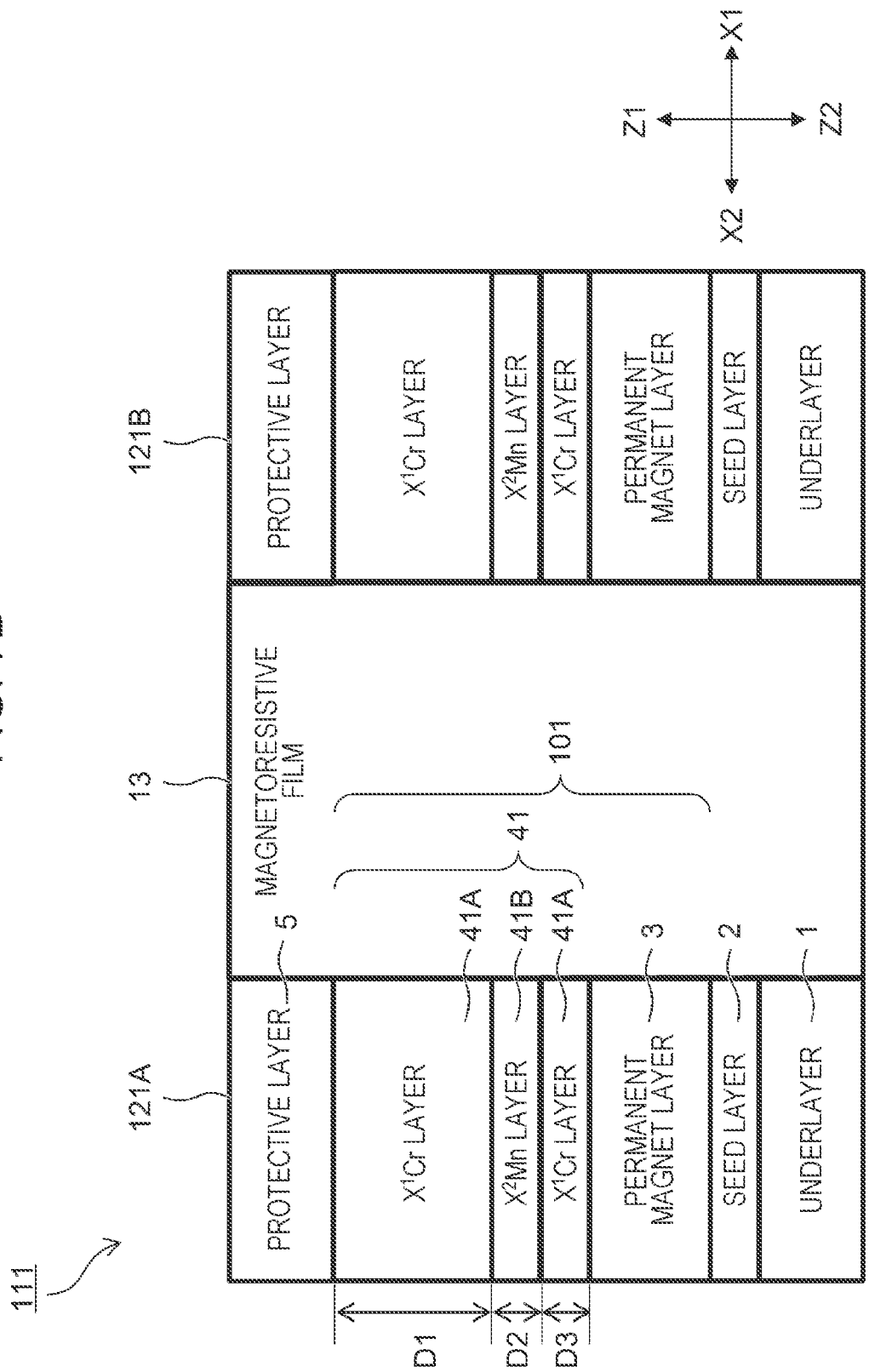

FIGS. 7A and 7B conceptually illustrate the configuration of a magnetic detecting element according to a second embodiment of the present invention. In the present embodiment, layers having the same function as the magnetic detecting element 11 illustrated in FIG. 2B are denoted by the same signs and the description thereof will be omitted.

The magnetic detecting element 111 according to the second embodiment includes: a magnetic detecting section 13 having an axis of sensitivity in the Y1-Y2 direction of FIG. 7A; a magnetic-field-applying bias film 121A positioned, relative to the magnetic detecting section 13, on the X2 side in the X1-X2 direction orthogonal to the axis of sensitivity; and a magnetic-field-applying bias film 121B positioned, relative to the magnetic detecting section 13, on the X1 side in the X1-X2 direction.

The magnetic-field-applying bias films 121A and 121B have a basic structure, such as an exchange-coupled film 101 composed of the permanent magnet layer 3 and the antiferromagnetic layer 41, in common with the magnetic-field-applying bias films 12A and 12B of the magnetic detecting element 11 according to the first embodiment. However, these bias films are different in structure of the antiferromagnetic layer 41.

Each antiferromagnetic layer 41 of the magnetic-field-applying bias films 121A and 121B has an alternately stacked structure in which an $X^1Cr$ layer 41A and an $X^2Mn$ layer 41B are alternately stacked in three layers (where $X^1$ and X2 are each one or two or more elements selected from the group consisting of platinum-group elements and Ni and may be the same or different). Each of these layers is formed by a sputtering process or a CVD process, for example. Through annealing treatment after film formation, the antiferromagnetic layer 41 is ordered and exchange coupled with the permanent magnet layer 3, thereby generating an exchange coupling field Hex in the permanent magnet layer 3 and increasing the coercivity Hc of the permanent magnet layer 3 relative to the coercivity Hc0 of the permanent magnet layer 3 alone.

As an embodiment of an alternately stacked structure in which the $X^1Cr$ layer 41A and the $X^2Mn$ layer 41B are stacked in three or more layers, FIG. 7B illustrates the antiferromagnetic layer 41 having a three-layered structure of $X^1Cr$ layer 41A/$X^2Mn$ layer 41B/$X^1Cr$ layer 41A with the $X^1Cr$ layer 41A in contact with the permanent magnet layer 3. However, the antiferromagnetic layer may have a three-layered structure of $X^2Mn$ layer 41B/XCr layer 41A/$X^2Mn$ layer 41B by switching $X^1Cr$ layer 41A with $X^2Mn$ layer 41B. In this three-layered structure, $X^2Mn$ layer 41B is in contact with the permanent magnet layer 3. An embodiment in which the number of layers in the antiferromagnetic layer 41 is four or more will be described hereinafter.

When the $X^1Cr$ layer 41A is the nearest to the permanent magnet layer 3, it is preferable to set the thickness D1 of the $X^1Cr$ layer 41A on the protective layer 5 side larger than the thickness D3 of the $X^1Cr$ layer 41A in contact with the permanent magnet layer 3 from a viewpoint of increasing the exchange coupling field Hex. Moreover, it is preferable that the thickness D1 of the $X^1Cr$ layer 41A in the antiferromagnetic layer 41 is larger than the thickness D2 of the $X^2Mn$ layer 41B. The ratio of the thickness D1 to the thickness D2 (D1:D2) is more preferably 5:1 to 100:1 and further preferably 10:1 to 50:1. Meanwhile, the ratio of the thickness D1 to the thickness D3 (D1:D3) is more preferably 5:1 to 100:1 and further preferably 10:1 to 50:1.

In the case of the three-layered structure of $X^2Mn$ layer 41B/XCr layer 41A/$X^2Mn$ layer 41B with the $X^2Mn$ layer 41B nearest to the permanent magnet layer 3, the thickness D1 of the $X^2Mn$ layer 41B nearest to the permanent magnet layer 3 may be set equal to the thickness D2 of the $X^2Mn$ layer 41B on the protective layer 5 side.

From a viewpoint of increasing the exchange coupling field Hex, $X^1$ of the $X^1Cr$ layer 41A is preferably Pt, whereas $X^2$ of the $X^2Mn$ layer 41B is preferably Pt or Ir and more preferably Pt. When the $X^1Cr$ layer 41A is a PtCr layer, $Pt_xCr_{100 at \%-x}$ (X is 45 at % or more and 62 at % or less) is preferable, and $Pt_xCr_{100 at \%-x}$ (X is 50 at % or more and 57 at % or less) is more preferable. From the same viewpoint, the $X^2Mn$ layer 41B is preferably a PtMn layer.

Figure 8A:
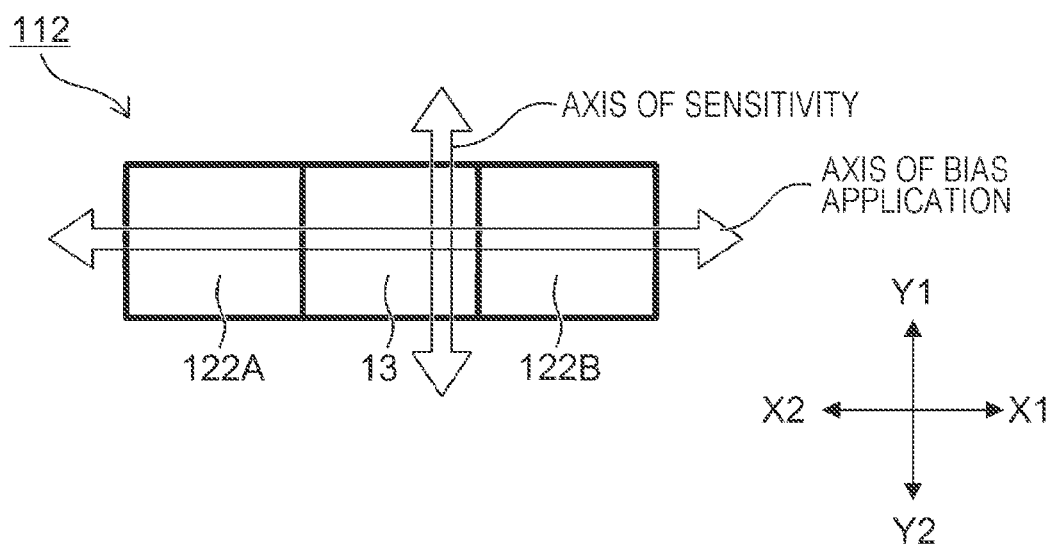

FIG. 8B illustrates the film configuration of a magnetic detecting element 112 according to a modification of the second embodiment of the present invention. In this example, layers having the same function as the magnetic detecting element 111 illustrated in FIG. 7B are denoted by the same signs and the description thereof will be omitted. In the magnetic detecting element 112, a permanent magnet layer 3 and an antiferromagnetic layer 42 constitute an exchange-coupled film 101A.

The magnetic detecting element 112 illustrated in FIG. 8B is different from the magnetic detecting element 111 of FIG. 7B in that the former has the number of layers in the antiferromagnetic layer 42 of 4 or more and includes a stacked unit portion formed by stacking a plurality of units each consisting of the $X^1Cr$ layer 41A and the $X^2Mn$ layer 41B (see FIG. 7B). FIG. 8B illustrates the stacked unit portion 4U1 to 4Un (n is an integer of 2 or more) formed by stacking n layers of a unit 4U1 consisting of an $X^1Cr$ layer 41A1 and an $X^2Mn$ layer 41B1 to a unit 4Un consisting of an $X^1Cr$ layer 41An and an $X^2Mn$ layer 41Bn.

In the stacked unit portion 4U1 to 4Un, the respective $X^1Cr$ layer 41A1 to $X^1Cr$ layer 41An have the same thickness D1, whereas the respective $X^2Mn$ layer 41B1 to $X^2Mn$ layer 41Bn also have the same thickness D2. By stacking units 4U1 to 4Un having the same configuration and subjecting the resulting stacked structure to annealing treatment, it is possible to generate a high exchange coupling field Hex and a high coercivity HC in the permanent magnet layer 3 of the exchange-coupled film 101A and to enhance high-temperature stability of the antiferromagnetic layer 42.

The antiferromagnetic layer 42 of FIG. 8B is composed of the stacked unit portion 4U1 to 4Un and $X^1Cr$ layer 41A, where the $X^1Cr$ layer 41A is in contact with the permanent magnet layer 3. However, the antiferromagnetic layer may consist of the stacked unit portion 4U1 to 4Un alone. In an antiferromagnetic layer 42 formed from a stacked structure solely consisting of the stacked unit portion 4U1 to 4Un, the $X^2Mn$ layer 41B1 is in contact with the permanent magnet layer 3.

The stacking number in the stacked unit portion 4U1 to 4Un may be set depending on the antiferromagnetic layer 42, the thickness D1, and the thickness D2. For example, when the thickness D2 is 5 to 15 Å and the thickness D1 is 30 to 40 Å, the stacking number is preferably 3 to 15 and more preferably 5 to 12 to increase the exchange coupling field Hex in a high-temperature environment.

Magnetic Sensor According to First Embodiment

Figure 9:
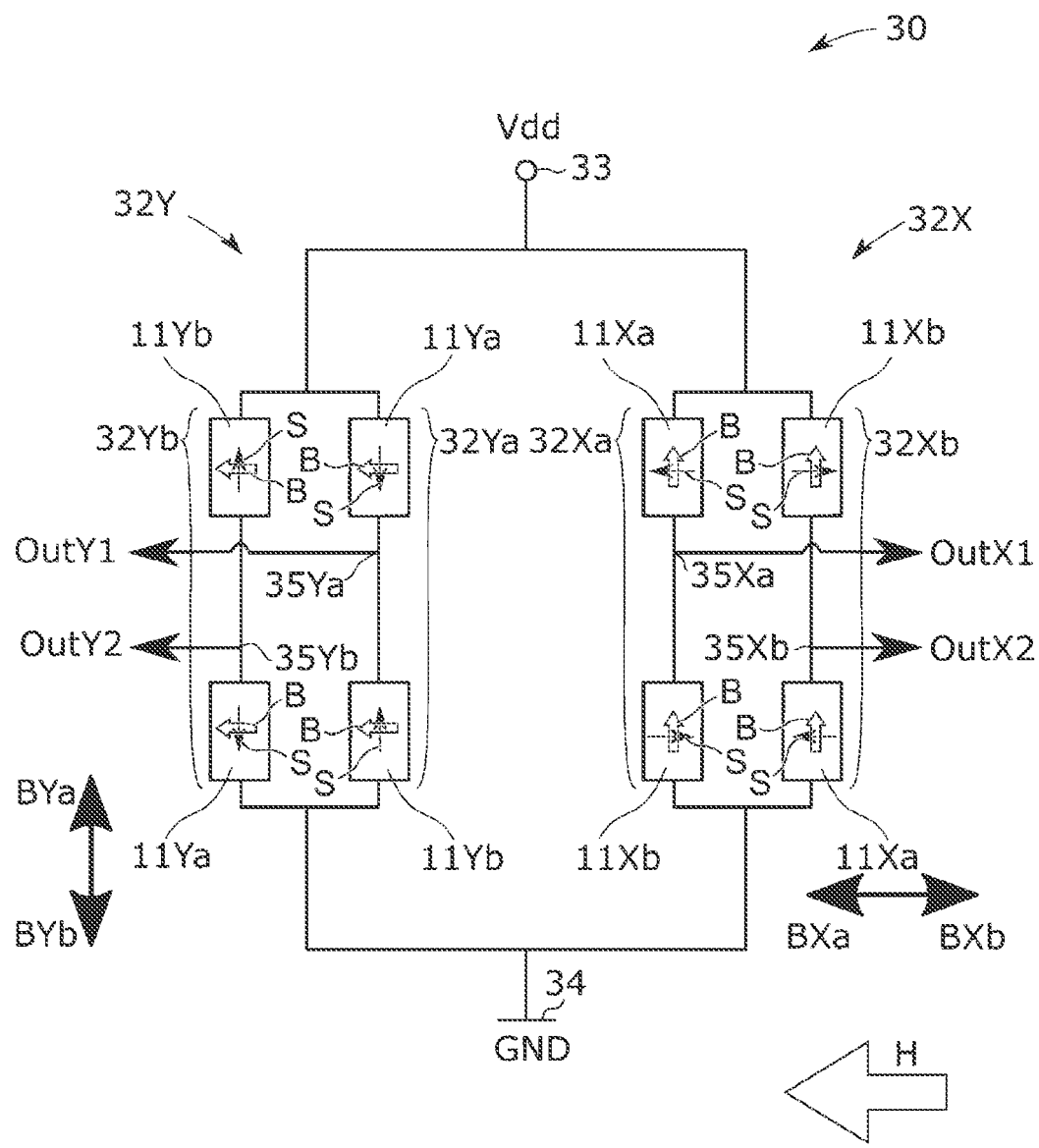
FIG. 9 is a circuit block diagram of a magnetic sensor 30 according to the first embodiment of the present invention.

Next, a magnetic sensor according to the first embodiment will be described. FIG. 9 illustrates a magnetic sensor (magnetic detection device) 30 formed by combining the magnetic detecting elements 11 illustrated in FIGS. 2A and 2B. In FIG. 9, the magnetic detecting elements 11 different in directions of the axes of sensitivity S (represented by black arrows in FIG. 9) are distinguished by different signs of 11Xa, 11Xb, 11Ya, and 11Yb. In the magnetic sensor 30, a plurality of magnetic detecting elements 11Xa, 11Xb, 11Ya, and 11Yb are provided on a single substrate.

The magnetic sensor 30 illustrated in FIG. 9 has a full-bridge circuit 32X and a full-bridge circuit 32Y. The full-bridge circuit 32X includes two magnetic detecting elements 11Xa and two magnetic detecting elements 11Xb, whereas the full-bridge circuit 32Y includes two magnetic detecting elements 11Ya and two magnetic detecting elements 11Yb. All of the magnetic detecting elements 11Xa, 11Xb, 11Ya, and 11Yb are the magnetic detecting element 11 illustrated in FIGS. 2A and 2B and include the magnetic-field-applying bias films 12A and 12B. Hereinafter, when not particularly distinguished, these magnetic detecting elements will be appropriately referred to as "magnetic detecting elements 11."

The full-bridge circuit 32X and the full-bridge circuit 32Y use magnetic detecting elements 11 that have different directions of the axes of sensitivity S represented by the black arrows in FIG. 9 to ensure different field directions to be detected but have the same mechanism for detecting a field. Hereinafter, the mechanism for detecting a field will be described by means of the full-bridge circuit 32X.

As represented by outlined arrows in FIG. 9, all of the bias application directions B of the magnetic detecting elements 11Xa and 11Xb point the BYa side in the BYa-BYb direction. This is because the magnetic detecting elements 11Xa and 11Xb are formed as follows. Specifically, the permanent magnet layers 3 of the two magnetic-field-applying bias films 12A and 12B in each of the magnetic detecting elements 11Xa and 11Xb are magnetized pointing the BYa side in the BYa-BYb direction; and the magnetic-field-applying bias film 12A, the magnetic detecting section 13, and the magnetic-field-applying bias film 12B are arranged aligning in the BYa-BYb direction in each of the magnetic detecting elements 11Xa and 11Xb. Meanwhile, all of bias application directions B of the magnetic detecting elements 11Ya and 11Yb point the BXa side in the BXa-BXb direction. This is because the magnetic detecting elements 11Ya and 11Yb are formed as follows. Specifically, the permanent magnet layers 3 of the two magnetic-field-applying bias films 12A and 12B in each of the magnetic detecting elements 11Ya and 11Yb are magnetized pointing the BXa side in the BXa-BXb direction; and the magnetic-field-applying bias film 12A, the magnetic detecting section 13, and the magnetic-field-applying bias film 12B are arranged aligning in the BXa-BXb direction in each of the magnetic detecting elements 11Ya and 11Yb.

The full-bridge circuit 32X is constructed by connecting in parallel a first series part 32Xa and a second series part 32Xb. The first series part 32Xa is formed by connecting the magnetic detecting element 11Xa and the magnetic detecting element 11Xb in series, whereas the second series part 32Xb is formed by connecting the magnetic detecting element 11Xb and the magnetic detecting element 11Xa in series.

A power supply voltage Vdd is applied to a power supply terminal 33 common to the magnetic detecting element 11Xa of the first series part 32Xa and the magnetic detecting element 11Xb of the second series part 32Xb. Meanwhile, a ground terminal 34 common to the magnetic detecting element 11Xb of the first series part 32Xa and the magnetic detecting element 11Xa of the second series part 32Xb is set to a ground potential GND.

A differential output (OutX1)–(OutX2) between an output potential (OutX1) at the midpoint 35Xa of the first series part 32Xa in the full-bridge circuit 32X and an output potential (OutX2) at the midpoint 35Xb of the second series part 32Xb is obtained as a detected output (detected output voltage) VXs in the X direction.

In the full-bridge circuit 32Y as well, by acting in the same manner as the full-bridge circuit 32X, a differential output (OutY1)–(OutY2) between an output potential (OutY1) at the midpoint 35Ya of the first series part 32Ya and an output potential (OutY2) at the midpoint 35Yb of the second series part 32Yb is obtained as a detected output (detected output voltage) VYs in the Y direction.

As represented by black arrows in FIG. 9, the directions of the axes of sensitivity S of the magnetic detecting elements 11Xa and the magnetic detecting elements 11Xb that constitute the full-bridge circuit 32X are orthogonal to the directions of the axes of sensitivity S of the magnetic detecting elements 11Ya and the magnetic detecting elements 11Yb that constitute the full-bridge circuit 32Y.

In the magnetic sensor 30 illustrated in FIG. 9, the free magnetic layers of the magnetic detecting elements 11 are in the magnetized state in the bias application directions B in the absence of an applied external field H. Upon application of an external field H, the magnetization direction of the free magnetic layer in each magnetic detecting element 11 changes to align in the direction of the external field H. On this moment, the resistance value varies depending on the relationship between vectors in the pinned magnetization direction (direction of the axis of sensitivity S) of the permanent magnet layer 3 and in the magnetization direction of the free magnetic layer.

When the external field H acts in the direction shown in FIG. 9, for example, an electric resistance decreases in the magnetic detecting elements 11Xa of the full-bridge circuit 32X since the direction of the axis of sensitivity S is the same as the direction of the external field H, whereas an electric resistance increases in the magnetic detecting elements 11Xb since the direction of the axis of sensitivity is opposite to the direction of the external field H. Such changes in electric resistance result in a maximum detected output voltage VXs=(OutX1)–(OutX2). As the external field H changes to point the right relative to the plane of the figure (point the BXb side in the BXa-BXb direction), a detected output voltage VXs decreases. Further, when the external field H points upward (the BYa side in the BYa-BYb direction) or downward (the BYb side in the BYa-BYb direction) relative to the plane of FIG. 9, a detected output voltage VXs becomes zero.

Meanwhile, in the full-bridge circuit 32Y, when the external field H points the left (the BXa side in the BXa-BXb direction) relative to the plane of the figure as illustrated in FIG. 9, the magnetic detecting elements 11Ya and the magnetic detecting elements 11Yb have the same electric resistance since the magnetization direction of the free magnetic layers (aligned in the bias application direction B) is orthogonal to the directions of the axes of sensitivity S (pinned magnetization direction) in all the magnetic detecting elements 11. Accordingly, the detected output voltage VYs is zero. When the external field H acts downward (the BYb side in the BYa-BYb direction) relative to the plane of FIG. 9, the detected output voltage VYs=(OutY1)−(OutY2) of the full-bridge circuit 32Y is a maximum. As the external field H changes to point upward (the BYa side in the BYa-BYb direction) relative to the plane of the figure, the detected output voltage VYs decreases.

As just described, as the direction of the external field H changes, detected output voltages VXs and VYs of the full-bridge circuit 32X and the full-bridge circuit 32Y also vary accordingly. Accordingly, it is possible to detect the moving direction and/or displacement (relative position) of a detection target on the basis of detected output voltages VXs and VYs obtained from the full-bridge circuit 32X and the full-bridge circuit 32Y.

FIG. 9 illustrates the magnetic sensor 30 configured to detect a field in the X direction and in the Y direction orthogonal to the X direction. However, the magnetic sensor 30 may include the full-bridge circuit 32X or the full-bridge circuit 32Y alone, which detects a field only in the X direction or in the Y direction, respectively.

Figure 10:
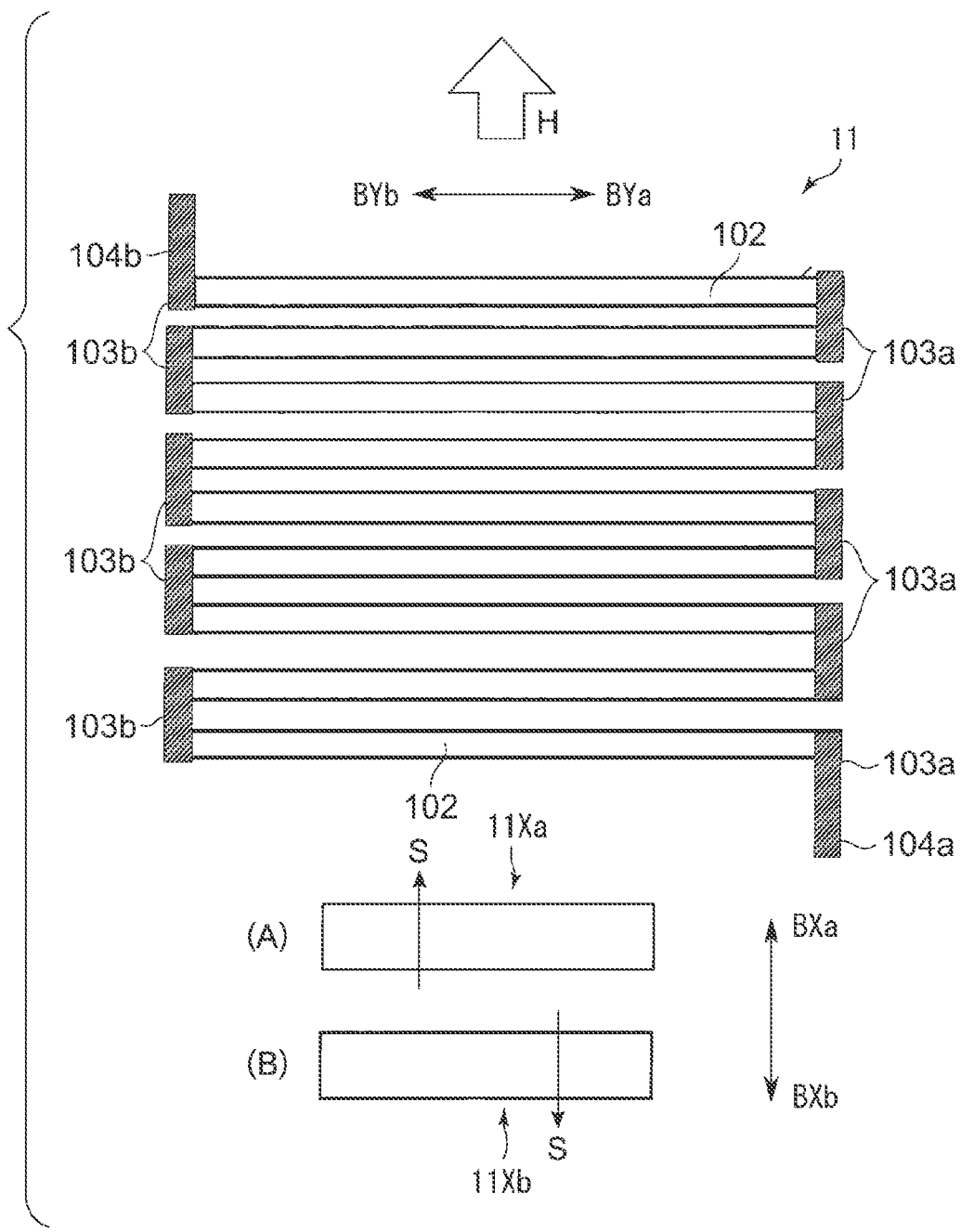
FIG. 10 is a plan view illustrating a magnetic detecting element 11 used for the magnetic sensor 30.

FIG. 10 illustrates the planar configuration of the magnetic detecting element 11Xa and the magnetic detecting element 11Xb. In FIGS. 9 and 10, the BXa-BXb direction is the X direction. In (A) and (B) of FIG. 10, the pinned magnetization directions P of the magnetic detecting elements 11Xa and 11Xb are represented by arrows. In the magnetic detecting element 11Xa and the magnetic detecting element 11Xb, the pinned magnetization directions P are in the X direction and point the opposite directions. The pinned magnetization directions P are in the same directions as the directions of the axes of sensitivity S.

As illustrated in FIG. 10, the magnetic detecting section 13 of the magnetic detecting element 11Xa and the magnetic detecting element 11Xb has stripe-shaped element portions 102. In each element portion 102, a giant magnetoresistive (GMR) film is formed by stacking a plurality of metal layers (alloy layers). The longitudinal direction of the element portion 102 is aligned in the BYa-BYb direction. A plurality of such element portions 102 are arranged in parallel, and the neighboring element portions 102 are connected through conductive sections 103a in the right ends (the BYa side ends in the BYa-BYb direction) and through conductive sections 103b in the left ends (the BYb side ends in the BYa-BYb direction). The element portions 102 are alternately connected with the conductive sections 103a and 103b in the right ends (the BYa side ends in the BYa-BYb direction) and in the left ends (the BYb side ends in the BYa-BYb direction), respectively, and are thus connected in a so-called meandering shape. The conductive section 103a at the right bottom and the conductive section 103b at the left top of the magnetic detecting elements 11Xa and 11Xb are formed as one body with connection terminals 104a and 104b, respectively.

In the magnetic sensor 30 illustrated in FIGS. 9 and 10, the magnetoresistive film that constitutes the magnetic detecting section 13 may be replaced with a tunnel magnetoresistive (TMR) film.

Magnetic Sensor According to Second Embodiment

Figure 11:
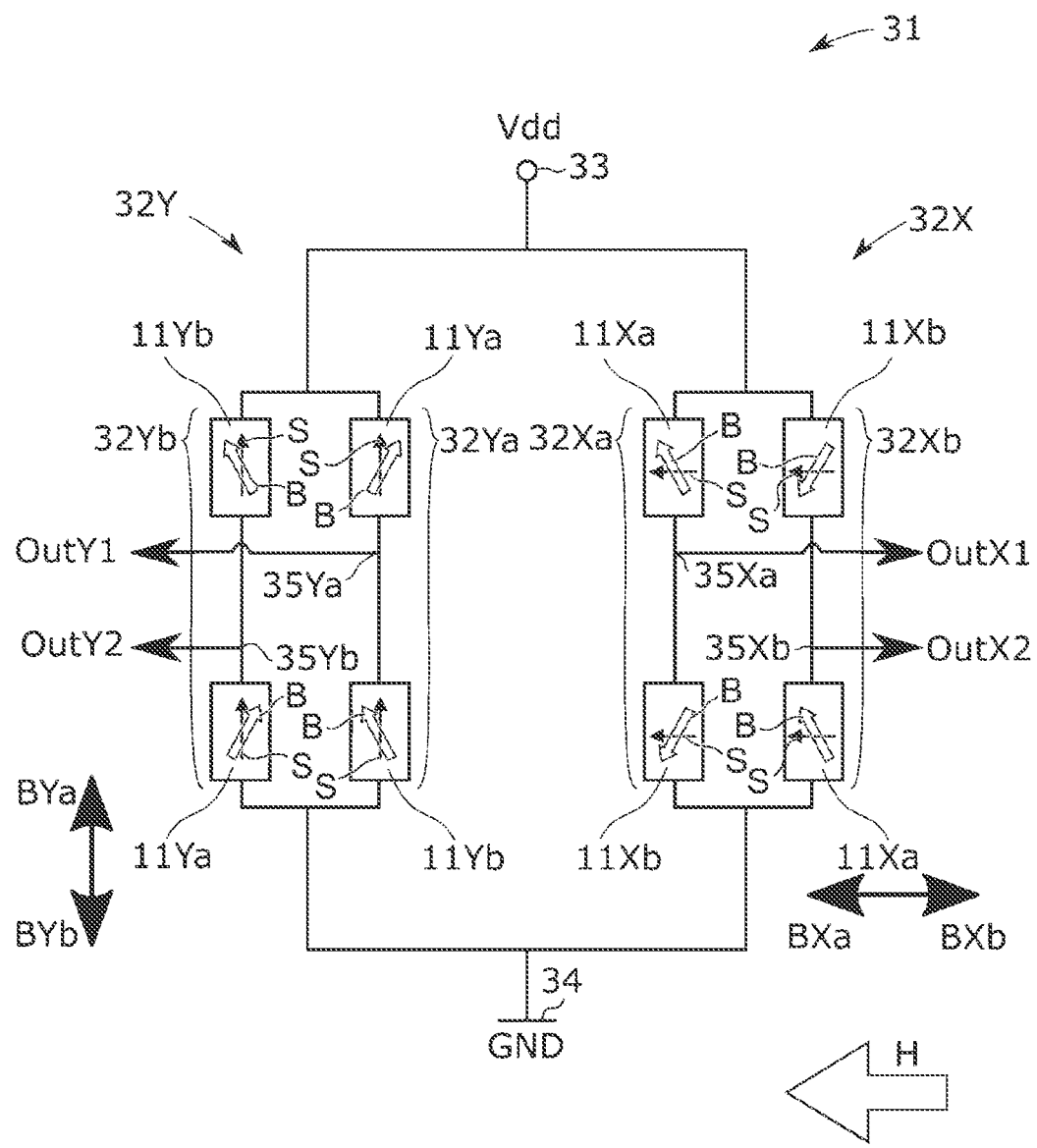
FIG. 11 is a circuit block diagram of a magnetic sensor 31 according to the second embodiment of the present invention.

FIG. 11 conceptually illustrates the configuration of a magnetic sensor according to the second embodiment of the present invention. In the present embodiment, layers having the same function as the magnetic sensor 30 illustrated in FIG. 9 are denoted by the same signs and the description thereof will be omitted.

The magnetic sensor 31 illustrated in FIG. 11 is different from the magnetic sensor 30 illustrated in FIG. 9 in the directions of the axes of sensitivity S and the bias application directions B. In the magnetic sensor 31, all the directions of the axes of sensitivity S of the magnetic detecting elements 11Xa and the magnetic detecting elements 11Xb point the BXa side in the BXa-BXb direction. The bias application direction B of the magnetic detecting elements 11Xa are tilted from the direction pointing the BXa side in the BXa-BXb direction toward the BYa side in the BYa-BYb direction. This is because the positions of the magnetic-field-applying bias film 12A and the magnetic-field-applying bias film 12B relative to the magnetic detecting section 13 are shifted in the opposite sides in the direction (the BYa-BYb direction) orthogonal to the magnetization direction (BXa-BXb direction) as illustrated in FIG. 6A. Meanwhile, the bias application directions B of the magnetic detecting elements 11Xb are tilted from the direction pointing the BXa side in the BXa-BXb direction toward the BYb side in the BYa-BYb direction. This is realized by setting the positions of the magnetic-field-applying bias film 12A and the magnetic-field-applying bias film 12B relative to the magnetic detecting section 13 in the opposite sides to the case of the magnetic detecting elements 11Xa.

In the same manner, all the directions of the axes of sensitivity S of the magnetic detecting elements 11Ya and the magnetic detecting elements 11Yb point the BYa side in the BYa-BYb direction, whereas the bias application direction B of the magnetic detecting elements 11Ya and the bias application direction B of the magnetic detecting elements 11Yb are set to point different directions by changing the positions of the magnetic-field-applying bias film 12A and the magnetic-field-applying bias film 12B relative to the magnetic detecting section 13.

As in the foregoing, by aligning the directions of the axes of sensitivity S of the magnetic detecting elements 11Xa and the magnetic detecting elements 11Xb as well as the directions of the axes of sensitivity S of the magnetic detecting elements 11Ya and the magnetic detecting elements 11Yb, the offset characteristics of the magnetic sensor 31 are readily improved since the number of times films are formed in a magnetic field is reduced during production of the magnetic sensor 31.

In the present example, the bias application directions B of the magnetic sensor 31 are set by employing the configuration illustrated in FIG. 6A. However, the bias application directions B of the magnetic sensor 31 may be set by adjusting the positions of the magnetic-field-applying bias film 12A and the magnetic-field-applying bias film 12B relative to the magnetic detecting section 13 as illustrated in FIG. 6B.

The foregoing embodiments are described for facilitating the understanding of the present invention but not for limiting the present invention. Accordingly, each element disclosed in the foregoing embodiments is also intended to encompass all the design changes and equivalents thereof within the technical scope of the present invention.

For example, in the above-described exchange-coupled film, the PtMn layer 4A is in contact with the permanent magnet layer 3, in other words, the PtMn layer 4A is directly stacked on the already stacked permanent magnet layer 3. However, other layers containing Mn (Mn layer and IrMn layer, for example) may be stacked between the PtMn layer 4A and the permanent magnet layer 3. Moreover, in the above-described embodiments, the permanent magnet layer 3 is stacked nearer to the underlayer 1 than the antiferromagnetic layers 4, 41, and 42. However, the antiferromagnetic layers 4, 41, and 42 may be stacked nearer to the underlayer 1 than the permanent magnet layer 3 (see Example 1).

EXAMPLES

Hereinafter, the present invention will be further specifically described by means of working examples and the like. However, the scope of the present invention is by no means limited to these working examples and the like.

Example 1

A magnetic-field-applying bias film 12A having the following film configuration was produced. In the Example and the Comparative Example below, the numerical values within the parentheses represent each thickness (Å). Through annealing treatment of the magnetic-field-applying bias film 12A at 350° C. for 20 hours, the permanent magnet layer 3 was exchange coupled with the antiferromagnetic layer 4.

substrate/underlayer 1: Ta (40)/seed layer 2: Cr (40)/permanent magnet layer 3: $Co_{80at\%}Pt_{20at\%}$ (30)/antiferromagnetic layer 4: [PtMn layer 4A: $Pt_{50at\%}Mn_{50at\%}$ (20)/PtCr layer 4B: $Pt_{50at\%}Cr_{50at\%}$ (280)]/protective layer 6: Ta (40)

Comparative Example 1

As the magnetic-field-applying bias film 12A illustrated in FIGS. 2A and 2B, a magnetic-field-applying bias film that fulfills the biasing function solely by the permanent magnet layer 3 was produced without stacking the antiferromagnetic layer 4.

The magnetization curve was measured for each magnetic-field-applying bias film 12A according to Example 1 and Comparative Example 1 by using a VSM (vibrating sample magnetometer), and the exchange coupling field Hex (unit: Oe) and coercivity Hc (unit: Oe) were determined from the obtained hysteresis loop. In Example 1, the same measurement was also performed for the state before annealing. The results are shown in Table 1.

TABLE 1

|  | Hex (Oe) | Hc (Oe) |
| --- | --- | --- |
| Comp. Ex. 1 | 0 | 1500 |
| Ex. 1 (before annealing) | 0 | 1600 |
| Ex. 1 | 2600 | 2200 |

As shown in Table 1, it has been confirmed that through annealing treatment, not only an exchange coupling field Hex is generated in the permanent magnet layer 3, but also a coercivity Hc increases relative to Comparative Example 1, in other words, relative to the coercivity Hc0 due to the permanent magnet layer 3 alone.

For the magnetic-field-applying bias film 12A according to Example 1, the magnetization curve was measured while changing the environmental temperature to determine the intensity of the exchange coupling field Hex. On the basis of these results, a blocking temperature Tb (unit: ° C.), a temperature Th at which the intensity of the exchange coupling field Hex becomes ½ that at room temperature (unit: ° C.), and a ratio R of the intensity of the exchange coupling field Hex at a measurement temperature of 300° C. to that at room temperature (300° C./room temperature) were obtained. The results were a blocking temperature Tb of 500° C., Th of 410° C., and R of 0.81. From these results, the magnetic-field-applying bias film 12A according to Example 1 has been confirmed to have a blocking temperature Tb of 500° C., which is sufficiently higher than a predicted temperature of 300° C. in the reflow process. For this reason, it was possible even at 300° C. to maintain about 80% or more of the exchange coupling field Hex at room temperature. Accordingly, the magnetic-field-applying bias film according to the present invention is less likely to lose the biasing function even in a high-temperature environment and exhibits resistance to a high magnetic field.

What is claimed is:

1. A magnetic-field-applying bias film comprising:
an exchange-coupled film including a permanent magnet layer and an antiferromagnetic layer stacked on the permanent magnet layer, wherein the antiferromagnetic layer includes an X(Cr—Mn) layer containing Cr, Mn, and one or two or more elements X selected from the group consisting of platinum-group elements and Ni,
the X(Cr—Mn) layer has a first region relatively near to the permanent magnet layer and a second region relatively distant from the permanent magnet layer, and
Mn content in the first region is higher than Mn content in the second region.

2. The magnetic-field-applying bias film according to claim 1, wherein the first region is in contact with the permanent magnet layer.

3. The magnetic-field-applying bias film according to claim 1, wherein the antiferromagnetic layer comprises stacked layers of a PtCr layer and an $X^0$Mn layer (where $X^0$ is one or two or more elements selected from the group consisting of platinum-group elements and Ni) nearer to the permanent magnet layer than the PtCr layer.

4. The magnetic-field-applying bias film according to claim 1, wherein the first region includes a portion having a Mn/Cr ratio as a ratio of Mn content to Cr content of 0.3 or more.

5. The magnetic-field-applying bias film according to claim 4, wherein the first region includes a portion having the Mn/Cr ratio of 1 or more.

6. The magnetic-field-applying bias film according to claim 1, wherein the antiferromagnetic layer comprises stacked layers of a PtCr layer and a PtMn layer in this order with the PtMn layer nearer to the permanent magnet layer.

7. The magnetic-field-applying bias film according to claim 6, wherein an IrMn layer is further stacked nearer to the permanent magnet layer than the PtMn layer.

8. A magnetic-field-applying bias film comprising
an exchange-coupled film including a permanent magnet layer and an antiferromagnetic layer stacked on the permanent magnet layer, wherein the antiferromagnetic layer has an alternately stacked structure in which an $X^1Cr$ layer, where $X^1$ is one or two or more elements selected from the group consisting of platinum-group elements and Ni, and an $X^2Mn$ layer, where $X^2$ is one or two or more elements selected from the group consisting of platinum-group elements and Ni and may be the same as or different from $X^1$, are alternately stacked in three or more layers and
wherein in the exchange-coupled film, a temperature at which an intensity of an exchange coupling field becomes ½ that at room temperature is 410° C. or higher.

9. The magnetic-field-applying bias film according to claim 8, wherein $X^1$ is Pt and $X^2$ is Pt or Ir.

10. A magnetic-field-applying bias film comprising:
an exchange-coupled film including a permanent magnet layer and an antiferromagnetic layer stacked on the permanent magnet layer, wherein the antiferromagnetic layer has an alternately stacked structure in which an $X^1Cr$ layer, where $X^1$ is one or two or more elements selected from the group consisting of platinum-group elements and Ni, and an $X^2Mn$ layer, where $X^2$ is one or two or more elements selected from the group consisting of platinum-group elements and Ni and may be the same as or different from $X^1$, are alternately stacked in three or more layers; and
wherein the antiferromagnetic layer includes a stacked unit portion comprising a stacked plurality of units each consisting of the $X^1Cr$ layer and the $X^2Mn$ layer.

11. The magnetic-field-applying bias film according to claim 10, wherein in the stacked unit portion the $X^1Cr$ layers have the same thickness, and the $X^2Mn$ layers have the same thickness, the thickness of the $X^1Cr$ layers being larger than the thickness of the $X^2Mn$ layers.

12. The magnetic-field-applying bias film according to claim 11, wherein a ratio of the thickness of the $X^1Cr$ layers to the thickness of the $X^2Mn$ layers is 5:1 to 100:1.

13. A magnetic detecting element comprising:
a magnetic detecting section having a magnetoresistive film including a pinned magnetic layer and a free magnetic layer; and
a magnetic-field-applying bias film comprising:
an exchange-coupled film including a permanent magnet layer and an antiferromagnetic layer stacked on the permanent magnet layer, wherein the antiferromagnetic layer includes an X(Cr—Mn) layer containing Cr, Mn, and one or two or more elements X selected from the group consisting of platinum-group elements and Ni,
the X(Cr—Mn) layer has a first region relatively near to the permanent magnet layer and a second region relatively distant from the permanent magnet layer, and
Mn content in the first region is higher than Mn content in the second region; wherein the magnetic-field-applying bias film is arranged around the magnetic detecting section to align magnetization directions of the free magnetic layer in the absence of an external magnetic field applied to the free magnetic layer.

14. A magnetic detection device comprising:
a magnetic detecting element comprising:
a magnetic detecting section having a magnetoresistive film including a pinned magnetic layer and a free magnetic layer; and
a magnetic-field-applying bias film comprising:
an exchange-coupled film including a permanent magnet layer and an antiferromagnetic layer stacked on the permanent magnet layer, wherein the antiferromagnetic layer includes an X(Cr—Mn) layer containing Cr, Mn, and one or two or more elements X selected from the group consisting of platinum-group elements and Ni,
the X(Cr—Mn) layer has a first region relatively near to the permanent magnet layer and a second region relatively distant from the permanent magnet layer, and
Mn content in the first region is higher than Mn content in the second region; wherein the magnetic-field-applying bias film is arranged around the magnetic detecting section to align magnetization directions of the free magnetic layer in the absence of an external magnetic field applied to the free magnetic layer.

15. The magnetic detection device according to claim 14 wherein a plurality of the magnetic detecting elements are arranged on a single substrate, and the plurality of the magnetic detecting elements include pinned magnetic layers having different pinned magnetization directions.

16. A magnetic-field-applying bias film comprising
an exchange-coupled film including a permanent magnet layer and an antiferromagnetic layer stacked on the permanent magnet layer, wherein the antiferromagnetic layer has an alternately stacked structure in which an $X^1Cr$ layer, where $X^1$ is one or two or more elements selected from the group consisting of platinum-group elements and Ni, and an $X^2Mn$ layer, where $X^2$ is one or two or more elements selected from the group consisting of platinum-group elements and Ni and may be the same as or different from $X^1$, are alternately stacked in three or more layers; and
the thickness of the $X^1Cr$ layers being larger than the thickness of the $X^2Mn$ layers.

* * * * *